United States Patent [19]

Oliver

[11] 4,237,209

[45] Dec. 2, 1980

[54] EROSION LITHOGRAPHY WITH HIGH-ASPECT NOZZLE

[75] Inventor: David W. Oliver, Schenectady, N.Y.

[73] Assignee: The United States of America as represented by the Secretary of the Army, Washington, D.C.

[21] Appl. No.: 37,258

[22] Filed: May 9, 1979

[51] Int. Cl.³ .......................... G03C 5/00; B24B 7/00
[52] U.S. Cl. .................... 430/317; 51/5 A; 51/310; 51/311; 51/312; 51/319; 51/439; 156/640; 156/644; 156/645; 427/264; 427/272; 427/348; 430/313; 430/316; 430/318; 430/319; 430/401
[58] Field of Search .................. 51/3, 5 R, 5 A, 439, 51/310, 311, 319, 312; 156/645, 640, 644; 430/311, 316, 317, 318, 319, 401; 427/348, 355, 272, 259, 264, 77, 96

[56] References Cited

U.S. PATENT DOCUMENTS

| 3,032,930 | 5/1962 | Williams | 51/439 |
|---|---|---|---|
| 3,257,759 | 6/1966 | Millhiser | 51/439 X |
| 3,392,052 | 7/1968 | Davis | 427/96 |
| 3,561,163 | 2/1971 | Arnold | 51/439 X |
| 3,694,260 | 9/1972 | Beggs | 427/77 |
| 3,710,515 | 1/1973 | Kulischenko et al. | 51/439 |

Primary Examiner—Edward C. Kimlin
Attorney, Agent, or Firm—Nathan Edelberg; Jeremiah G. Murray; Bernard Franz

[57] ABSTRACT

A variety of technologies have been applied in the development of a bonded grid cathode. Erosion lithography is used for making the fine-detail grid structure, combining air erosion and lithographic techniques. To obtain openings of the order of 0.001 inch (one mil) or smaller, a nozzle with a high aspect ratio exit opening is used, and the cathode grid structure is scanned. A photo resist in which the grid pattern is developed is used over the molybdenum or tungsten grid film. The metal film is removed from the grid openings by chemical etching. The photo resist over the metal grid is used as a composite mask for removing the BN insulation in the openings by erosion with $Al_2O_3$ powder from the special nozzle on the air blast gun.

9 Claims, 15 Drawing Figures

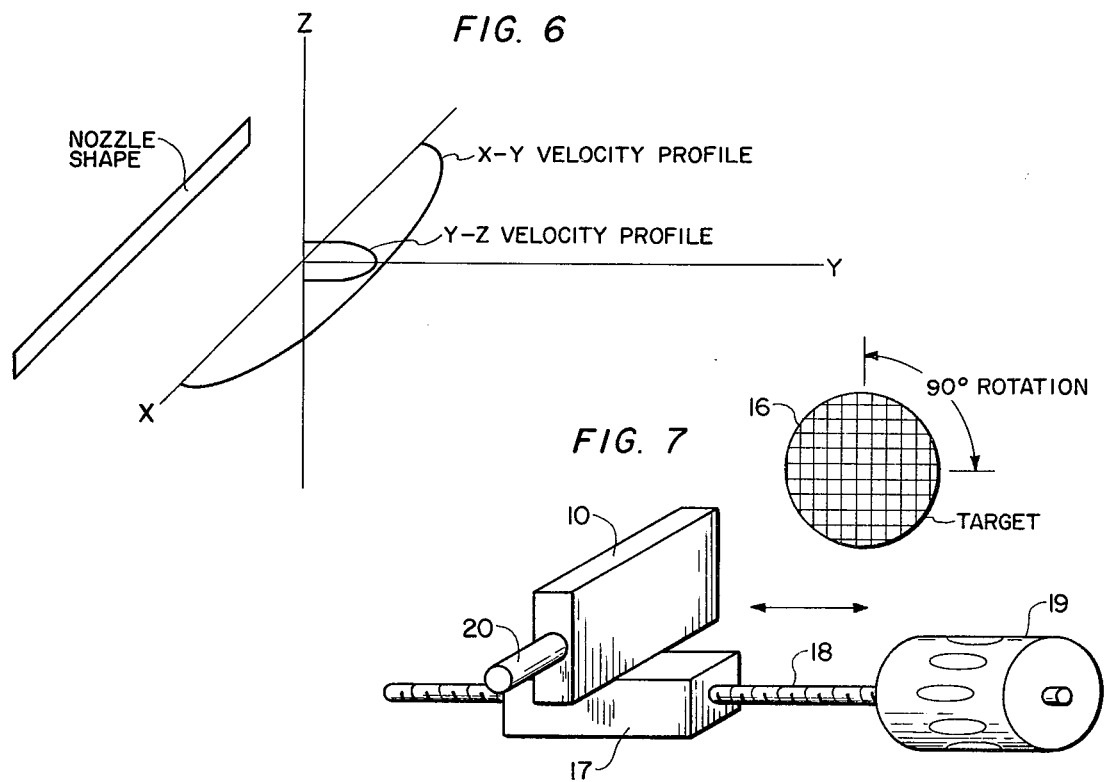
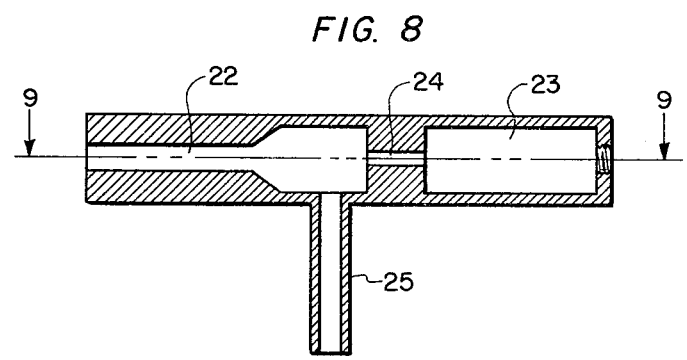
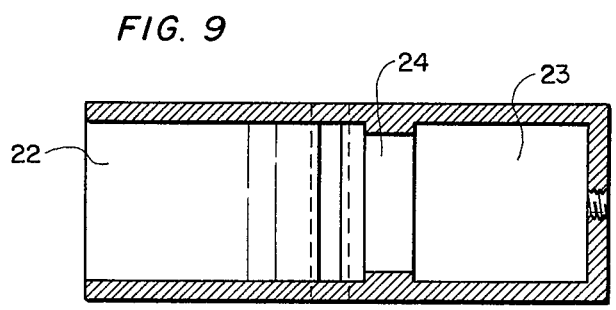

RECTANGULAR

ELLIPTICAL

DOG-BONE

EROSION LITHOGRAPHY WITH HIGH-ASPECT NOZZLE

The invention described herein may be manufactured and used by or for the Government for governmental purposes without the payment of any royalties thereon or therefore.

BACKGROUND OF THE INVENTION

This invention relates to erosion lithography and nozzles; and in particular to manufacture of a bonded cathode and electrode structure for microwave triode tubes.

The grid-controlled power amplifier has long been useful for a variety of microwave applications. The L-64 and L-67 types, developed by J. E. Beggs and his associates as a consequence of work sponsored by the United States Army Electronics Command, have extended the range of performance of such devices. These advances were attained through the use of a closely spaced grid-cathode structure operating in the high-vacuum environment of a titanium-ceramic tube structure.

The construction of grid-cathode units with even closer spacing of grid and cathode and capable of high grid dissipation was continued using a grid and a heater which are ridgily bonded to the cathode by an insulating film. Boron nitride (BN) was identified as the preferred insulating material. Chemical vapor deposition (CVD) of BN was developed, and grid patterns with detail as small as 0.002 inch were formed by erosion through a mask with air driven $Al_2O_3$ particles. The d-c characteristics of bonded grid tubes showed a high utilization of emission as useful plate current, ability to withstand large positive grid bias, and the option of a high level of current collection or a wide gridanode gap. See U.S. Pat. Nos. 3,599,031, 3,638,062, and 3,694,260 by J. E. Beggs.

Several significant technical problems remained, potentially blocking the successful development of still further improvements at higher microwave frequencies of a bonded grid triode. One of these was lack of a process for forming grid openings with dimensions as small as 0.001 inch without either undercutting the supporting insulation or shorting out the insulating layer with metal.

The use of erosion lithography for electrical components is shown in U.S. Pat. No. 3,392,052 by J. Davis. The practice has been to use cylindrical nozzles for sand blasting or erosion lithography with powered abrasives, as shown, for example, in U.S. Pat. No. 3,032,930 by S. B. Williams. However, in attempting to use cylindrical nozzles for finely detailed patterns over large areas, it has been the experience that in spite of favorable erosion rates, the patterns would be completely destroyed in some regions and not cut at all in others.

A method of removing photo resist in a partial pressure of a gas, which may be hydrogen, at about 100 degrees C is shown in U.S. Pat. No. 3,837,856. Other U.S. patents on removing resist are 3,787,239; 3,582,401; 3,458,401; 3,458,312; and 3,676,219.

SUMMARY OF THE INVENTION

An object of the invention is to provide a fine pattern with openings of the order of 0.001 inch or less, in particular, for the grid pattern of a bonded grid-cathode structure.

A feature of the invention is the method of erosion lithography using a nozzle with a high aspect ratio and scanning the structure being worked with respect to the nozzle. Another feature relates to the nozzle having a high aspect ratio.

In the method of making a bonded grid-cathode unit, an insulating layer is formed on the cathode, a molybdenum or tungsten metal grid film is formed on the insulator, photo resist is formed on the grid film and the grid pattern developed therein, the grid openings in the metal film are removed by chemical etching, and erosion using the high aspect ratio nozzle while scanning the grid-cathode unit removes the insulation in the openings down to the cathode.

CROSS REFERENCE TO RELATED APPLICATIONS

This application partially discloses matter claimed in related applications to be filed on the same day in the same package. The others are incorporated herein and made a part hereof as though fully set forth.

Features relating to the high resistivity electrical insulating layers of boron nitride with a diffusion barrier of silicon nitride are covered in an application by D. W. Oliver and C. R. Trzaskos, Ser. No. 037,257.

The combination getter and internal structure with heat shield is covered in an application by D. W. Oliver and N. T. Lavoo, Ser. No. 037,256.

DESCRIPTION OF THE DRAWING

FIG. 6 illustrates the velocity effect of an erosion gun with a rectangular nozzle exit;

FIG. 7 shows the method of air erosion lithography with a high aspect ratio nozzle and scanning;

FIGS. 8 and 9 are views of an air erosion gun with rectangular nozzle, suction and orifice;

DETAILED DESCRIPTION

Figure 1:
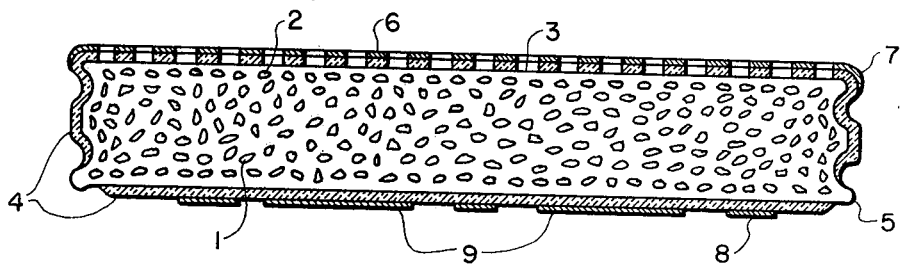
FIG. 1 illustrates a prior art bonded grid-cathode-heater unit for a microwave vacuum tube.

FIG. 1 shows a cross section of a prior art bonded heater-cathode-grid structure for use in the microwave power-amplifier tube disclosed in U.S. Pat. No. 3,638,062 by J. E. Beggs. It embodies a cathode disk (twin-grooved around its edge, boron nitride (BN) insulation, and tungsten (W) film grid and heater electrodes. This control unit can be efficiently heated, can withstand large voltages between grid and cathode, and has a high grid dissipation capacity. It is operated in the tube near 1050 degrees C.

The cathode disk used in this assembly can be an impregnated type such as a Philips Type B or a Semicon Type S. The impregnant is removed from the outer surfaces prior to the BN deposition so as to prevent a direct reaction with the chemical vapors. This cleaning procedure also permits the BN insulation to become mechanically locked in the open pores of the tungsten surface.

Chemical vapor deposition processes are used to deposit BN and W layers onto the cathode. The completed structure is made by opening holes in the tungsten and BN layers. Other forms of the tube and of the bonded heater-cathode-grid structure are shown in U.S. Pat. Nos. 3,599,031 and 3,694,260 by J. E. Beggs. These patents show the structure and the method of manufacture, and include a discussion of alternate materials which may be used. The three Beggs patents are incorporated herein and made a part hereof by reference.

In FIG. 1, the tungsten cathode 1 has open pores 2, an emission impregnant and an emission surface 3. An insulating layer 4 of BN is formed on all sides by chemical vapor deposition. The portion of the insulating layer in and adjacent the lower groove is removed to provide a cathode contact region 5. A tungsten film is formed over the insulating layer, and perforations are formed by providing a mask and using a blast gun to erode through the insulating layer to form a control grid 6. The tungsten film extends to the upper groove to provide a grid contact region 7. A heater 8 is formed in the tungsten film on the opposite face, with heater contact regions 9. Grid patterns with detail as small as 0.002 inch have been formed by erosion through a mask with air driven by $Al_2O_3$ particles. U.S. Pat. No. 3,694,260 also discloses forming a photo resist layer over the tungsten film, developing a grid pattern therein, forming the grid holes in the tungsten film by etching, and using the photoresist and tungsten film as a composite mask for air blast erosion of the holes in the BN insulator.

Further development of the tube structure, and method of manufacturing it have continued, to obtain a tube whose characteristics are: a peak power output of one kilowatt at a duty factor of 0.1, a 1 db bandwidth of 400 megahertz at 3,300 megahertz, a power gain of 15 db, and an overall efficiency of 30 percent. Calculation shows that these characteristics require as tube parameters: grid-cathode capacitance equal or less than 175 picofarads, grid transparency of 75%, insulator dielectric constant of approximately 4; cathode area equal or less than 2.6 square centimeters, cathode emission density equal or greater than 1.4 ampere per square centimeter average or 6.4 ampere per square centimeter peak.

The most important parameters for selecting the insulating film are the film dielectric constant, resistivity, and stability at the cathode operating temperature. The preferred material selected is BN. This material also has a good expansion match to tungsten, and has the unique property among high resistivity refractories of being soft and, hence, not subject to cracking due to expansion differentials.

CONSTRUCTION OF GRID PATTERNS WITH FINE DETAIL

Several means of producing grid structures with fine detail, of the order of 1 to 0.5 mils, were attempted in this work without success. These have included air abrasion through a mechanical mask, rf sputter etching, and laser machining. Detail finer than about 2 mils is very difficult to achieve with mechanical masks and air abrasion, because the structural members of the mask become very weak mechanically and vibrate in the air stream, allowing abrasion to occur in regions they are supported to mask. Radio frequency sputtering cuts through the layers with excellent resolution even for high aspect ratio holes. However, the rf sputtering is a slow process, requiring several hours. Furthermore, sputtering into the tungsten cahode deposits metal on the interior of the holes cut through the BN insulator, shorting grid to cathode. Several modifications to the sputtering method have been studied, including varying the d-c bias of the cathode disk, changes in the molecular weight of the gas, and use of reactive gases. None of these modifications improved the speed of the method sufficiently or solved the shorting problem.

Laser machining was not satisfactory because of the large number of holes which must be formed one at a time, because of residual tungsten deposits on the BN insulation, and because the high transparency of the grid requires the holes to be close together so that heat dissipation problems arise during the laser machining. Chemical etching of BN to make the grid structures has not been attempted because the etching takes are too long, the required aspect ratio of holes cannot be obtained, and severe undercutting of the structure will occur.

A process has been developed which combines photolithography, etching, and air erosion. It has been shown to provide speed in fabrication and the requisite resolution and cutting depth. The technique shows real promise in solving the problems of fabrication of grid patterns with fine detail.

The mechanical requirements of a bonded grid tube at the desired frequencies are rather stringent. The dimensions of the grid opening must be of the order of 1 to 0.5 mils, and a cathode ⅜ inch in diameter with a grid of 75 percent transparency requires approximately one million holes cut through successive layers of tungsten (3 $\mu$m thick), $Si_3N_4$ (1 $\mu$m), BN (10 $\mu$m), $Si_3N_4$ (1 $\mu$m), and into the tungsten cathode. It is permissible for a few percent of the holes to be incompletely opened. However, the layered structure cannot be allowed to tear away in regions of appreciable size, because the anode will be able to directly affect the cathode holes in those regions and grid control will suffer. The number of openings can be reduced to about 10,000 by using slots having a 10/1 planar aspect ratio. After processing, the cathode surface must be clean for good emission, and the BN surfaces must be free of conductive metal films which would short grid to cathode. There are too many holes to be economically cut sequentially, and the processing used should allow individual steps to be carried out simultaneously on a number of cathodes with rapid setup and processing. Where processing techniques such as photolithograpy are used, the need for mask alignment should be avoided.

A series of experiments were performed using air erosion with No. 400 mesh alumina (ultimate particle size up to 1.5 mils). Both wire wound masks and masks photoetched into thin metal were employed. The usual grid structure made with wire wound masks consists of a series of long grooves eroded through the BN insulation. As one reduces the diameter of the wire in the mask to make the grooves narrow and closely spaced, the rigidity of the wire against bending is rapidly decreased. Masks wound from wire 2 mils or less in diameter did not protect the tungsten surface under the wire. The lack of rigidity of the fine wires caused them to vibrate in the airstream from the abrasion gun. The tungsten film under the wires received only partial protection from abrasive and it was either abraded away or sufficiently worked and deformed by impinging alumina to break the bond to the layer of $Si_3N_4$ below.

Wire wound masks were made more rigid by the use of a structure with heavier cross supports brazed at right angles to the fine wires. Grid structures originally designed for the L-67 tube were ideal. The fine wires were then ground half round so that they would seat flat against the surface to be abraded. Air erosion results were identical to those experienced before. The tungsten either eroded away or puckered. Improvement was obtained by gluing the mask to the cathode surface prior to abrasion. With a glued mask the tungsten under the wires did not erode and one could cut through the BN insulation. However, the wires were not rigid enough to prevent the BN from being broken free at the lower interface near the cathode surface.

Small areas were successfully machined with a glued mask when the wire wound mask was replaced with a metal sheet into which 4 mil holes had been etched on 6-mil centers. This type of mask produced a pattern with good lateral rigidity. The tungsten was well protected and in the absence of long, thin strips of BN insulation with poor lateral rigidity, fracture at the interface of cathode and BN was not experienced. This method had several disadvantages, however. Gluing down of masks was difficult to achieve with good adherence in all areas and a uniformly thin bond. There were difficulties in removing the mask without damage to the structure and contamination of the cathode surface. The masks were not reusable.

A subsequent set of experiments was performed using photoresist as an erosion mask. This approach has the advantages of enabling one to combine chemical etching with air erosion using the same resist mask, and of employing an exposure mask which is not damaged and may be used repeatedly. Three resist systems were explored: dichromated gelatine, Waycoat SC resist (Philip A. Hunt Company), and Dynachem CMR 5000 (Dynachem Corporation). Several other commercial resist materials (dichromated fish glue and dichromated polyvinyl alcohol) might be useful, but these were not studied. Light sensitive epoxies and polyurethanes are interesting systems to consider but were not found available as resist systems. Polyurethanes in particular are reported to have excellent erosion resistance.

The use of photo-resist masks dates from the first photoengraving by Joseph Nicephore Niepce in 1826. The use of dichromated-colloid layers as a light sensitive medium was discovered by Suckow in 1830. These systems are hardened by light and chemical treatment. Patterns are made by dissolving away the unexposed and more soluble portions of the layer with warm water. In recent times new resist systems have been made from light sensitive resins that are soluble in organic solvents rather than in water. A number of such resists are commercially available and are essential to the present chemical milling and silicon planar device businesses.

Three resist systems have been explored in this work as masks for erosion lithography. The first examined was lime process gelatine sensitized with ammonium dichromate. It was selected because it was expected to have better abrasion resistance than the resins used in commercial resists. The characteristics of the gelatine resist led to experiments with Waycoat SC resist. (No systematic intercomparison has been made of the many commercial resist systems which are available).

The gelatine system was sensitized by adding ammonium dichromate to the gelatine solution. High concentrations of dichromate improve the light sensitivty of the gelatine layers but lead to precipitation of ammonium dichromate crystals during drying of the films. A standard weight ratio of ammonium dichromate to gelatine of 1:6 was found to provide good light sensitivity without crystal precipitation for gelatine solutions made up with widely varying water content and, hence, viscosity.

Resist films may be deposited by rolling, spraying, dipping, and spinning. Rolling and spraying were not used because good uniformity in film thickness required equipment not on hand, and the immediate interest was feasibility of resists as abrasion masks. Dipping and spinning are both reasonable processes for initial experiments. Spinning was chosen because it produces a uniform film except at the edge of the disk and because spinners were available in lamilar flow hoods in rooms with appropriately filtered light. Dipping coats both sides of the disk but leaves a 10 percent taper in film thickness and excess material at the last point to emerge from the resist solution.

Spin speeds from 2000 rpm to 10,000 rpm for 30 to 60 seconds were found to produce satisfactory films. These speeds then set the requirements of solution viscosity. In order to abrade through ten microns of BN, it is necessary to mask with a resist thickness of 2 to 7 microns. Experiment showed that resist solution viscosity near 500 cp would result in films in the desired thickness range. A viscosity of 500 cp for solutions of about 0.31 gelatine-to-water ratio solution was prepared by stirring the gelatine into cold water to swell it and then heating gently to 40 degrees C. Ammonium dichromate was added to sensitize the solution, and it was stored at 38 degrees C. to prevent it from setting. The pH of the solution can be adjusted to control its viscosity (see S. E. Shepard and B. C. Hoack, "The Structure of Gelatine Sols and Gels, Part IV: Fluidity and Hydrolysis," *Journal of Physical Chemistry*, Vol. 36, 1932, p. 2319) and (see Jaromir Kosar, *Light Sensitive Systems*, John Wiley and Sons, Inc., New York, N. Y., 1965) characteristics, but was not adjusted from the value pH 5.8 obtained in preparing the solution.

Initial experiments were conducted with films spun on 1-inch-diameter quartz disks. The disk surface was flooded prior to spinning and the films were slowly dried after spinning in an ambient of 70 percent humidity. A $NH_4Cl$-$KNO_3$ solution in a desiccator jar was used to maintain the drying conditions. A 3-second exposure to ultraviolet light in a PRECO 200-watt exposure unit was followed by a 20-minute development with 38 degrees C. water. After development, the films were further hardened with ultra-violet light or mucochloric acid (see U.S. Pat. No. 2,080,019). After air abrasion was performed, the remaining resist was stripped with sodium hypochlorite or takamine gelatinate No. 3 enzyme (Miles Laboratories, Inc.).

This resist system had several disadvantages. The dichromated gelatine solution was found to be so unstable with time that viscosity increased, solubility decreased, and light sensitivity decreased. If allowed to stand at 38 degrees C. for several days the solution set. In the course of storage for shorter periods the appropriate times for exposure and development were affected. The gelatine solution and dichromate could be stored separately, but under these conditions the viscosity of the gelatine solution decreased with time (by a factor of ten in a few days) so that film thickness was affected. Adjustment of pH improved stability of the gelatine resist system, but for consistent results the resist solution needed to be freshly made. The gelatine resist is a water soluble system. Its use is somewhat incompatible with the commercial resist systems, which are best handled in a room with low humidity. Some components, such as spinners, should not be used for both resist systems; separate facilities are therefore needed for the gelatine resist. Finally, the gelatine system was found to be subject to reticulation. Details of the order of 0.5 mil could be reproduced, bat edge detail was distorted by film reticulation.

The apparent success of gelatine resist led to the examination of Waycoat SC resist as an alternative. A comparison of erosion resitance was made for pyrolytic BN, quartz, gelatine resist, Waycoat SC resist, and sintered tungsten cathodes. Material samples were held a standard distance from an air abrasion gun and material removal was measured after eroding the sample for a period of time. The gun was operated at a constant pressure of 80 psi and No. 400 mesh alumina was used in all of the measurements. The results are plotted in FIG. 2, which shows material removed in mils versus the erosion time. One notes that BN erodes more rapidly than any other material examined and that quartz erodes almost as rapidly. In a number of experiments quartz disks have been used to model the erosion performance to be expected with CVD BN films. The lowest erosion rate was found for tungsten.

The relative erosion rates of tungsten and BN are so widely different that tungsten itself should make an excellent erosion mask. Deposited tungsten films have not been used in this manner because the impact of the abrasive mechanically works the tungsten, breaks its bond to lower layers, and makes it pucker. Once it is free from the substrate, further impact can break it up. Rather, the tungsten is used as an auxiliary mask, under the patterned resist. After patterning the resist, the tungsten is chemically etched. The resist with tungsten under it comprises the erosion mask for cutting through the BN layer. The role of the resist is to first protect parts of the tungsten from chemical etching, and the serve as an erosion mask to protect the tungsten from the direct impact of the abrasive. The elasticity of the polymer mask is essential for distrubution of the impact of the air driven particles.

Figure 2:
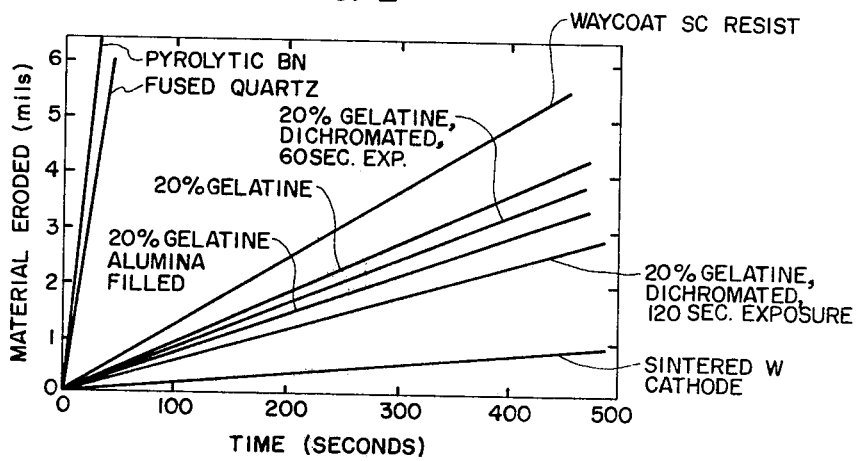
FIG. 2 is a graph showing rates of removal for different materials with erosion guns.

The erosion of gelatine films was compared for films with and without ammonium dichromate and UV hardening, and with and without a fine suspension of alumina in the resist solution. The best erosion resistance was found for UV hardened films and the poorest for unhardened films. The addition of fine alumina improved abrasion resistance somewhat but interfered with the resolution obtainable. The abrasion of a Waycoat SC film, also shown in FIG. 2, is more rapid than that of gelatine. However, the abrasion rate of SC resist is much less than that of BN and the commercial resist is time stable and compatible with the automatic equipments and other resists in use in the semiconductor industry.

The Waycoat SC resist was applied under conditions typical of semiconductor processing. Disks were prebaked for 45 minutes at 250 degrees C., in nitrogen. On cooling they were coated in a high acceleration spinner by flooding the surface with solution and spinning at 6000 rpm for one minute. Film thicknesses of 4 to 5 microns were obtained. The spun films were allowed to sit for 15 to 30 minutes for evaporation of excess solvent and then were given a soft bake at 105 degrees C. for 30 minutes. Exposures of 1 second were made in the PRECO 200-watt station, which was used in the work with gelatine films. The patterns were developed in a PLP Model 693 spray developer with times of 180 -second development, 30 -second KMER rinse, 30-second isoproponal rinse, and 30-second air dry. Following development, the film was given a hard bake at 150 degrees C. for 30 minutes. Resolution was checked with an Itek 2 progressive resolution target. In the Itek resolution pattern, depths of the cuts are up to 8 $\mu$m. It was found to be advantageous to operate the air abrasion gun at 30 psi and to use 600-mesh alumina. Resolution of 1 to $\frac{1}{2}$ mil has been obtained with this masking-erosion technique; this resolution is adequate for the grid structures which need to be fabricated.

In applying this erosion method to cathodes one can choose to chemically etch through the upper tungsten layer or to cut through with air abrasion. FIG. 2 shows that the erosion rate of the tungsten is much lower than that of SC resist and that unnecessary wear of the mask would occur if the upper tungsten layer were eroded. It is preferable to chemically etch through the tungsten so that the SC resist and tungsten becomes a composite mask. The etched tungsten helps to define the holes to be abraded in the BN, and the resist above the tungsten protects it from mechanical working and puckering.

Figure 3:
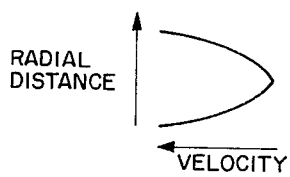
FIG. 3 illustrates the velocity effect of an air erosion gun with cylindrical nozzle.

Initial experiments with erosion lithography for very fine detail failed totally. In spite of the favorable erosion rates for the various materials in use, the patterns would be completely destroyed in some regions and not cut at all in others. This difficulty was traced to the use of cylindrical nozzles on the air erosion gun. To avoid penetrating the resist it is necessary to use modest gas flow velocities for which the radial velocity distribution is parabolic, as shown in FIG. 3. Since the cutting rate is proportional to particle energy (i.e., to $V^2$), the cutting rate varies as the fourth power of the radial distance from the center of the air stream. This results in the formation of a small central pit.

Figure 4:
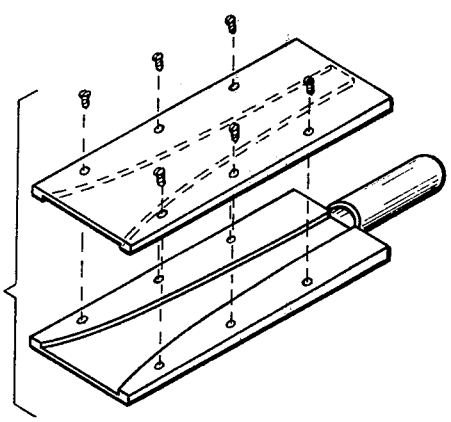
FIGS. 4 and 5 show adapter nozzles with high aspect ratio rectangular exit openings.

The problem is solved by using a rectangular nozzle of high aspect ratio, as shown in FIG. 4, and scanning the sample in front of the nozzle. Aspect ratio is defined as the ratio of the longer to the shorter dimension. A high aspect ratio means that the nozzle cross section at the exit is relatively long compared to the width. The rectangular nozzles produce uniform cutting within 30 percent, over a 1-inch length. Several nozzle designs were tried; the system in use was designed for constant area in the transition from circular to rectangular cross section.

Figure 5:
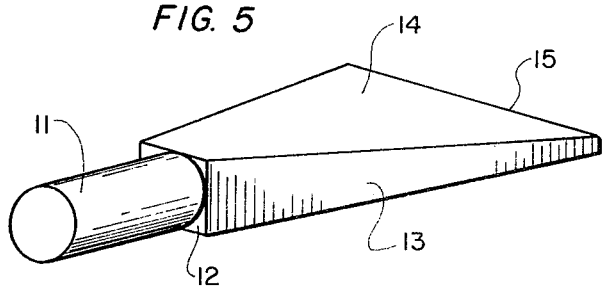

FIG. 5 shows another double tapered nozzle having a rectangular exit of high aspect ratio, designed for constant cross sectional area in the transition from circular to rectangular cross section. The cylindrical inlet 11 has a transition 12 to a square cross section. There is a vertical taper 13 and a horizontal taper 14 to a rectangular exit 15. The vertical and horizontal taper provide the constant cross sectional area.

FIG. 6 is a graph showing the X-Y and Y-Z velocity profiles produced by the rectangular exit nozzle shape shown on the left, with the long dimension along the X axis and the short dimension along the Z axis. The Y axis represents the velocity.

FIG. 7 shows how the nozzle 10 may be used to scan a cathode-grid unit 16. The nozzle 10 is mounted on a carriage 17. A lead screw 18 through the carriage is driven by a scan drive motor 19. The air and particle stream enters through the tube 20, and passes through the nozzle to the target 16 in which the grid pattern is formed. The motion of the carriage and nozzle is such that the rectangular exit has its short dimension in the direction of movement, and its long dimension perpendicular thereto. It is advantageous to rotate the target 16 by 90 degrees between passes of the nozzle, for more uniform abrasion.

FIGS. 8 and 9 show an alternative structure for providing a nozzle with a rectangular exit, in which the entire erosion gun housing is built in rectangular form. The nozzle 22 is completely rectangular. The air from a rectangular source 23 passes through a rectangular orifice 24, with entrance of the abrasive particles through a rectangular suction tube 25.

Figure 10:
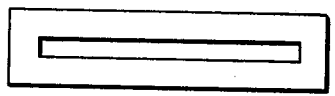
FIGS. 10, 11, and 12 are diagrams of the exit openings of different configurations for high aspect ratio of air erosion nozzles.
Figure 12:
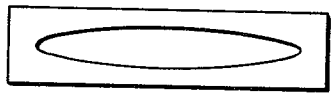
Figure 11:
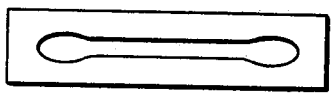
Figure 13:
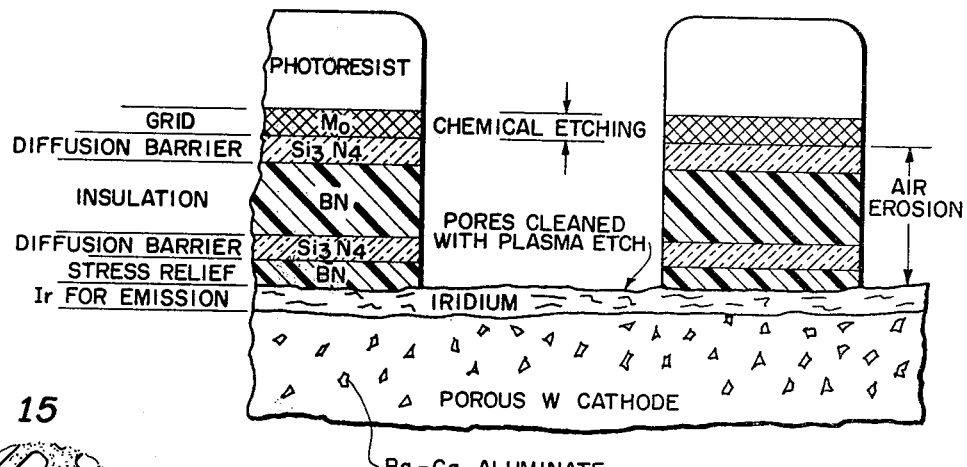
FIG. 13 is a diagram of a section of a bonded grid-cathode structure, indicating steps of formation and the functions.

FIGS. 11 and 12 show alterations of the exit shape from that of a simple rectangle to increase the length of the region which is uniformly eroded, FIG. 10 rectangular exit, FIG. 11, dogbone exit, FIG. 13 elliptical exit.

FABRICATION PROCEDURE FOR THE BONDED-GRID TRIODE AMPLIFIER

The bonded-grid triode amplifier is fabricated in several parallel assembly steps. The cathode-grid structure is formed as shown in FIG. 13.

Figure 14:
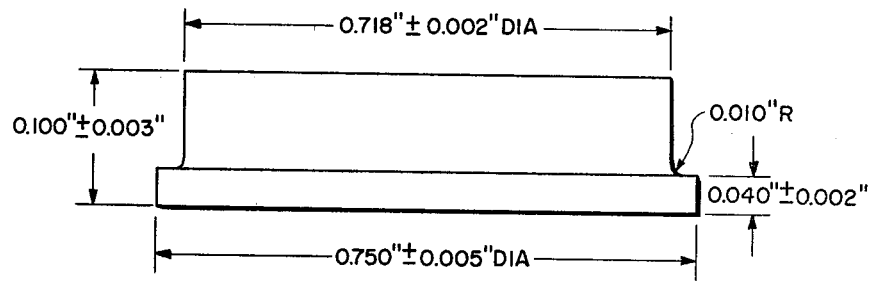
FIG. 14 shows a cathode blank as received from the manufacturer.

The cathode blanks are manufactured by Semicon Associates, Inc., a subsidiary of Varian Associates. The first step in the cathode preparation is to polish the blanks because, as received from the manufacturer (see FIG. 14) the blanks have a lathe-cut surface. It is necessary to dry-polish in two stages; first with a coarse-grit polishing wheel and then with a fine polishing wheel to remove machining marks and 2 to 3 mils of the original surface. The blanks are then sandblasted with alumina powder to provide a rough surface for better adhesion of the insulator layers. Residual traces of aluminum oxide are removed by cleaning the blanks ultrasonically in ethyl alcohol. The blanks are then hydrogen-fired at 1325 degrees C. (brightness temperature) for 10 minutes to remove contaminants which may have been introduced in the polishing operation. They are then activated in high vacuum at 1200 degrees C., to develop emission and to prepare them for the iridium coating.

The emission capabilities of the cathodes are measured prior to iridium coating. Iridium is then deposited on the cathodes by a chemical vapor deposition process.

The next step in the process is to deposit the insulation on the surface of the iridium-coated cathodes. The insulation is a laminated structure (FIG. 13), with each discrete layer of the structure serving a specific function. This step of the process is again a chemical vapor deposition.

The first layer deposited is BN, 0.5 $\mu$m thick; this layer acts as a stress reliever between the substrate and the subsequently deposited layers. The next layer is $Si_3N_4$ 0.4 to 0.6 $\mu$m thick, which acts as a diffusion barrier, preventing cathode activators from diffusing into the insulating layer. Next, a layer of BN 10 to 15 $\mu$m thick is laid down to provide the required electrical insulation between the cathode and grid. The final layer is $Si_3N_4$ 0.2 to 0.3 $\mu$m thick; this serves to improve the adhesion between the metallic grid film and the insulating structure.

The grid film coating step follows the insulation coating. The metallic grid film is also obtained by a chemical vapor deposition process. In this case molybdenum carbonyl is decomposed on the cathode surface. The temperature of the cathode is held at 1075 degrees C. A partial pressure of hydrogen is used to prevent carbide formation. The thickness of the film is about 5 $\mu$m, obtained in a 45-minute coating cycle. The hydrogen pressure is about 20 microns; the $Mo(CO)_6 + CO$ is also about 20 microns.

The grid and heater structures are photolithographed according to the following steps:

1. Application of photo-resist. The photo-resist material is spread over the surface of the cathode by means of a fresh, eye dropper type of dropping pipet. The cathode is then rotated at high speed (2000 to 8000 rpm). This spreads the photo-resist material into a thin, uniform layer.
2. A short baking cycle follows, during which the photo-resist layer is dried.
3. The process is then repeated on the opposite face of the cathode. This coat is also dried.
4. The grid and heater patterns are then formed by exposing the appropriate faces of the cathode through a mask to form the required patterns in the photo-resist.
5. Each unit is next put through a developing process which removes the unexposed photo-resist.
6. The final step in the photolithographic procedure is a bake which cures the photoresist and gives it the required toughness.

The grid detail is then developed in the following steps: 1. The metal film is removed from the grid openings using an acid chemical etch having the composition:

76 parts by volume $H_3PO_4$ (phosphoric acid)
6 parts by volume $CH_3COOH$ (acetic acid)
3 parts by volume $HNO_3$ (nitric acid)
15 parts by volume $H_2O$ (water, distilled)

The etch time is 9 to 15 minutes. The heater side is etched at the same time to remove extraneous metal and leave the metal film heater pattern.

2. Nitride insulation is removed from the grid openings by the air abrasion method, using air-classified $Al_2O_3$ powder from which the fine and coarse fractions have been removed. A specially designed nozzle coupled to an automatic scanning device, with controlled air pressure, provides uniform abrasion over the entire exposed insulator surface of the cathode. The photo-resist was previously developed to a toughness that will withstand the air abrasion until the insulation is substantially removed from the grid openings.
3. The cathode is subjected to ultrasonic cleaning in ethanol to remove $Al_2O_3$ particles which might be imbedded in the cathode surface.
4. The photo-resist is removed by heating the cathode to approximately 400 degrees C. in a low-pressure 910 microns) hydrogen atmosphere. At this temperature the photo-resist evaporates leaving no residue.
5. The cathode is again subjected to ultrasonic cleaning in ethanol to remove $Al_2O_3$ particles which had been imbedded in the photo-resist and still remain.
6. Any insulation remaining in the grid openings or lodged in the pores of the cathode is removed by etching with ionized freon gas.
7. The final step is firing the unit in hydrogen to remove surface contaminants and aid in reactivation of the cathode. This step ensures complete removal of fluorides. The structure is now ready for mounting within the vacuum enclosure.

Figure 15:
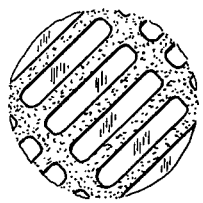
FIG. 15 is a drawing from a photomicrograph of a grid structure made by erosion lithography.

FIG. 15 is a drawing made from a photomicrograph of a grid structure made by erosion lithography. The openings are 1.2 mils by 8.2 mils. The depth is 0.75 mils, the transparency 47%, and the density 48,000 holes per square inch. The machining time for a ¾ inch diameter structure was four minutes. The minimum hole size by this process is ½ mil. The maximum density of holes by this process is 1,000,000 holes per square inch. Transparency is defined as the ratio of the area of the openings to the total area of the surface in which the pattern is formed.

CONCLUSION

To summarize the above, air erosion with abrasive powders is a rapid and efficient method of removing material. Application of the method has been limited in many instances by ability to erode uniformly over a wide area. This limitation arises from the very rapid variation of cutting rate with radial distance in the cylindrical air stream generally employed. Air velocity varies approximately quadratically with radius in the cylindrical air streams, and cutting rate varies between particle velocity to the 2nd power and to the 2.3 power. In consequence, cutting rate with a cylindrical air stream varies at least as the fourth power of radius. Even a large diameter air erosion nozzle cuts a work piece in only a small region near the center of the air stream.

The solution is a nozzle with a noncylindrical cross section of large aspect ratio to provide uniform erosion over a wide region. Uniform erosion of a large area of a work piece can be accomplished by scanning the work piece below the nozzle. Several designs are useful. All use exits with a large aspect ratio; the simplest being a rectangular opening.

What is claimed is:

1. The method of making a precise bonded grid on a cathode, comprising the steps of:
   (a) forming an insulator layer on said cathode,
   (b) forming a metal layer for the grid, on the insulator layer,
   (c) forming a photo-resist layer on the metal layer,
   (d) exposing the photo-resist layer with means to form a grid pattern, followed by a developing process which selectively removes part of the photo-resist layer to expose openings of said grid pattern,
   (e) removing the metal layer in said openings,
   (f) using air blasting with an abrasive powder to remove the insulator layer in said openings, with the photo-resist and the metal layer acting together as a mask;
   the improvement wherein for step (f) a special elongated nozzle and scanning provides substantially uniform abrasion over the entire exposed surface of said insulator layer, wherein the nozzle has an exit which is relatively long in one dimension and narrow in the orthogonal dimension to provide a substantially uniform velocity of the abrasive powder along the long dimension, and the scanning of the grid-cathode structure with respect to the nozzle comprises successive passes in a direction generally perpendicular to the long dimension of the projection of the nozzle.

2. The method as claimed in claim 1, wherein there is a periodic 90 degree rotation of the grid-cathode structure with respect to the nozzle between scanning passes.

3. The method as claimed in claim 2, wherein said exit of the nozzle is rectangular.

4. The method as claimed in claim 1, wherein said nozzle adapts a standard cylindrical air erosion gun for uniform erosion, the nozzle having an approximately constant cross-sectional area from a cylindrical entrance to its rectangular exit.

5. The method as claimed in claim 1, wherein said powder is $Al_2O_3$.

6. The method as claimed in claim 1, wherein said insulator layer is principally BN formed by chemical vapor deposition.

7. The method as claimed in claim 6, wherein said step (b) comprises forming said grid from the group of metals comprising W and Mo, using chemical vapor deposition from the metal carbonyl.

8. The method as claimed in claim 6, including the further step after step (f) of removing the remainder of the photo-resist.

9. The method as claimed in claim 6, wherein said abrasive powder is $Al_2O_3$.

* * * * *